United States Patent
Kim et al.

(10) Patent No.: US 9,709,375 B2
(45) Date of Patent: Jul. 18, 2017

(54) METHOD AND APPARATUS FOR CREATING MAGNETIC FIELD MAP BASED ON FLOOR PLAN INFORMATION OF BUILDING

(71) Applicant: Samsung Electronics Co., Ltd., Suwon-si (KR)

(72) Inventors: Seong Eun Kim, Suwon-si (KR); Yong Kim, Seoul (KR); Eung Sun Kim, Suwon-si (KR); Hyun Gi Ahn, Incheon (KR); Ji Hyun Yoon, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 865 days.

(21) Appl. No.: 13/930,159

(22) Filed: Jun. 28, 2013

(65) Prior Publication Data

US 2014/0021942 A1    Jan. 23, 2014

(30) Foreign Application Priority Data

Jul. 23, 2012    (KR) .................. 10-2012-0079972

(51) Int. Cl.
| | | |
|---|---|---|
| *G01C 21/08* | (2006.01) | |
| *G01B 7/00* | (2006.01) | |
| *G01C 21/20* | (2006.01) | |
| *G01R 33/10* | (2006.01) | |
| *H04W 4/04* | (2009.01) | |

(52) U.S. Cl.
CPC ............ *G01B 7/003* (2013.01); *G01C 21/206* (2013.01); *G01R 33/10* (2013.01); *H04W 4/04* (2013.01)

(58) Field of Classification Search
CPC .... G01C 21/206; G01C 21/08; G01C 21/005; G06F 17/00; G06F 17/16; G06K 9/00624; G06T 7/0042; G01B 7/003; G01R 33/10; G01S 5/0252; G01S 5/0257; H04W 4/02; H04W 4/04
USPC ........................................................... 702/5
See application file for complete search history.

(56) References Cited

U.S. PATENT DOCUMENTS

| | | | | |
|---|---|---|---|---|
| 7,302,345 | B2 * | 11/2007 | Kwon .................... | G01R 33/10 33/355 R |
| 7,890,262 | B2 | 2/2011 | Judd et al. | |
| 9,080,874 | B2 * | 7/2015 | Haverinen .......... | G01C 21/206 |
| 9,154,914 | B2 * | 10/2015 | Haverinen .............. | H04W 4/04 |

(Continued)

FOREIGN PATENT DOCUMENTS

| | | |
|---|---|---|
| JP | 2001-42934 | 2/2001 |
| JP | 2005-300896 | 10/2005 |

(Continued)

OTHER PUBLICATIONS

Anousaki et al., Simultaneous Localization and Map Building for Mobile Robot Navigation, Sep. 1999, IEEE Robotics & Automation Magazine, pp. 42-53.*

(Continued)

*Primary Examiner* — Huan Tran
(74) *Attorney, Agent, or Firm* — NSIP Law (57) ABSTRACT

Provided are a method and an apparatus for creating a magnetic field map that extracts magnetic field information of a building from floor plan information of the building. The magnetic field map of the building may be generated based on the floor plan information and the magnetic field information.

12 Claims, 5 Drawing Sheets

(56) References Cited

U.S. PATENT DOCUMENTS

| | | | |
|---|---|---|---|
| 9,316,501 B2* | 4/2016 | Haverinen | G01C 21/005 |
| 2006/0244446 A1 | 11/2006 | Dewdney et al. | |
| 2013/0177208 A1* | 7/2013 | Haverinen | G01C 21/206 |
| | | | 382/103 |
| 2013/0179074 A1* | 7/2013 | Haverinen | G01C 21/08 |
| | | | 701/525 |
| 2013/0179075 A1* | 7/2013 | Haverinen | G01C 21/08 |
| | | | 701/525 |

FOREIGN PATENT DOCUMENTS

| | | |
|---|---|---|
| KR | 10-2005-0046298 | 5/2005 |
| KR | 10-0506097 | 8/2005 |

OTHER PUBLICATIONS

Foxlin, E. M., Generalized Architecture for Simultaneous Localization, Auto-Calibration, and Map-Building, Dec. 2002, Proceedings of the 2002 IEEE/RSJ Int'l Conference on Intelligent Robots and Systems, pp. 527-533.*

Rekleitis et al., Collaborative Exploration for Map Construction, Jul. 29-Aug. 1, 2001, Proceedings of 2001 IEEE Int'l Symposium on Computational Intelligence in Robotics and Automation, pp. 296-301.*

Etienne Le Grande et al., 3-Axis Magnetic Field Mapping and Fusion for Indoor Localization, 2012 IEEE International Conference on Multisensor Fusion and Integration for Intelligent Systems (MFI), Sep. 13-15, 2012. Hamburg, Germany, pp. 358-364.*

Ambient magnetic fielld-based indoor location technology, IndoorAtlas Ltd., Jul. 2012.*

Finally: Indoor GPS System Uses Your Smartphone and Earth's Magnetic Field, Kevin Lee, PCWorld http://www.pcworld.com/article/258961/finally_indoor_gps_system_uses_your_smartphone_and_earth_s_magnetic_field.html.*

Indoor navigation on your smartphone, using the Earth's magnetic field—just like a pigeon by Sebastian Anthony on Jul. 9, 2012.*

Ambient magnetic fielld-based indoor location technology, IndoorAtlas Ltd., Jul. 2013.*

BloombergBusiness, Janne Haverinen: Mapping the Great Indoors, Olga Kharif, Aug. 9, 2012.* https://www.youtube.com/watch?v=PkehW3fkpLQ, IndoorAtlas' indoor location technology , published on Jul. 5, 2012.* https://www.youtube.com/watch?v=uoWs0c5TeTA, IndoorAtlas' indoor location technology demo (6x) , published on Jul. 3, 2012.* https://www.youtube.com/watch?v=JDvofmr7d1c, Indoor Atlas DEMO Enterprise 2014 , published on Apr. 3, 2014.*

How It Works_IndoorAtlas, printed on Jul. 11, 2016.*

Chung et al. "Indoor Location Sensing Using Geo-Magnetism", MobiSys'11, Jun. 28-Jul. 1, 2011, Bethesda, Maryland, USA.*

Greg Sterling, Magnetic Positioning_The Arrival of 'Indoor GPS', Opus Research Report, Jun. 2014.*

* cited by examiner

METHOD AND APPARATUS FOR CREATING MAGNETIC FIELD MAP BASED ON FLOOR PLAN INFORMATION OF BUILDING

CROSS-REFERENCE TO RELATED APPLICATION(S)

This application claims the benefit under 35 USC §119(a) of Korean Patent Application No. 10-2012-0079972, filed on Jul. 23, 2012, in the Korean Intellectual Property Office, the entire disclosure of which is incorporated herein by reference for all purposes.

BACKGROUND

1. Field

The following description relates to a method and apparatus for creating a magnetic field map based on floor plan information of a building.

2. Description of Related Art

There are various methods that may be used to estimate the location of a terminal based on a signal. For example, a proximity method may estimate a location of a terminal using a mobile communication signal to approximate a location of a terminal with respect to a location of a cellular base station serving the terminal. This method may perform triangulation by measuring a transmission range of a signal to at least two base stations that are adjacent to the terminal.

Another method may estimate a location of a terminal using a local area network (LAN) to approximate a location of a terminal using a location of an access point (AP) belonging to a wireless LAN terminal, or may estimate the location of the terminal by performing pattern matching with a fingerprint map recorded in advance, based on a measured signal strength of an adjacent AP.

Another method may estimate a location of a terminal using an ultra-wide band (UWB) and may perform triangulation by measuring a distance to the AP that generates a UWB signal.

The aforementioned algorithms may measure environmental variables that undergo various changes as the terminal moves, and based on a result of the measurement, the location of the terminal may be estimated. However, these aforementioned algorithms do not account for buildings or other structures that a terminal may be located within and around, and therefore, using these methods it may be difficult to determine an accurate location of a terminal that is located within or around a building.

SUMMARY

In an aspect, there is provided a method of creating a magnetic field map, the method including receiving floor plan information of a building, extracting magnetic field information of the building based on the floor plan information of the building, and creating a magnetic field map of the building based on the floor plan information and the magnetic field information.

The floor plan information may comprise at least one of a position, a height, a thickness, and a size of a steel frame, a steel bar, and/or piping that is included in the building.

The extracting the magnetic field information of the building may comprises calculating a magnetic interference with respect to the building based on the floor plan information, and extracting the magnetic field information based on the magnetic interference.

The method may further comprise determining a location of a feature point on the magnetic field map based on the floor plan information and the magnetic field information.

The determining the location of the feature point may comprise setting a position of a section to be measured based on the floor plan information and the magnetic field information, determining an interval and a location at which a sample magnetic field is to be measured with respect to the section, and determining the location of the feature point based on the interval and the location at which the sample magnetic field is to be measured.

The feature point may comprise an area in which a change of a magnetic field on the magnetic field map exceeds a predetermined degree of deviation.

The method may further comprise creating guide information for measuring a magnetic field with respect to the building based on the feature point.

The method may further comprise providing the guide information to at least one of a mobile terminal and a robot.

The guide information may comprise a location in the building at which a magnetic field is to be measured and an interval at which the magnetic field is to be measured.

In an aspect, there is provided a non-transitory computer-readable medium comprising a program for instructing a computer to perform the method.

In an aspect, there is provided an apparatus for creating a magnetic field map, the apparatus including a network module configured to receive floor plan information of a building, an extracting unit configured to extract magnetic field information of the building based on the floor plan information of the building, and a map creating unit configured to create a magnetic field map of the building based on the floor plan information and the magnetic field information.

The floor plan information may comprise at least one of a position, a height, a thickness, and a size of a steel frame, a steel bar, and/or piping that is included in the building.

The extracting unit may comprise a calculator configured to calculate a magnetic interference with respect to the building based on the floor plan information, and an extractor configured to extract the magnetic field information based on the magnetic interference.

The apparatus may further comprise a locating unit configured to determine a location of a feature point on the magnetic field map based on the floor plan information and the magnetic field information.

The locating unit may be configured to set a section to be measured based on the floor plan information and the magnetic field information, determine an interval and a location at which a sample magnetic field is to be measured with respect to the section, and determine the location of the feature point based on the interval and the location at which the sample magnetic field is to be measured.

The feature point may comprise an area in which a change of a magnetic field on the magnetic field map exceeds a predetermined degree of deviation.

The apparatus may further comprise an information creating unit configured to create guide information for measuring a magnetic field with respect to the building based on the feature point.

The network module may be configured to provide the guide information to at least one of a mobile terminal and a robot.

The guide information may comprise a location in the building at which a magnetic field is to be measured and an interval at which the magnetic field is to be measured.

The apparatus may further comprise a storing unit configured to store the floor plan information and the magnetic field information.

Other features and aspects will be apparent from the following detailed description, the drawings, and the claims.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, description of well-known functions and constructions may be omitted for increased clarity and conciseness.

Figure 1:
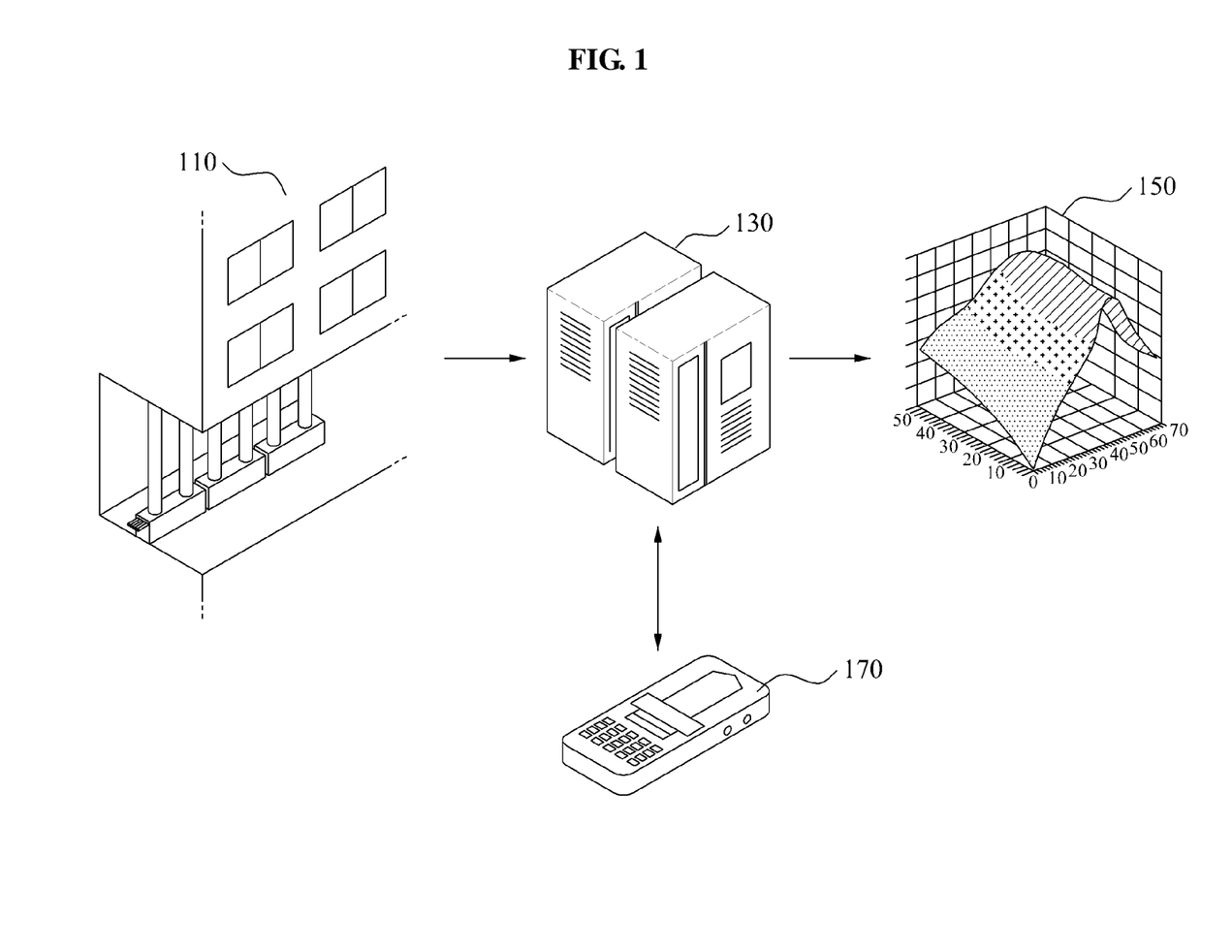
FIG. 1 is a diagram illustrating an example of a process of creating a magnetic field map.

FIG. 1 illustrates an example of a process of creating a magnetic field map.

Referring to FIG. 1, a server 130 may extract magnetic field information of a building based on floor plan information 110 of the building, and create a magnetic field map 150 based on the extracted magnetic field information and the floor plan information 110 of the building. Also, the server 130 may create guide information to measure a magnetic field with respect to the building based on the extracted magnetic field information or a variety of information in addition to or other than the aforementioned information. The server 130 may transmit the guide information to an apparatus 170 for measuring a magnetic field. As another example, the server may transmit the guide information to a robot for measuring a magnetic field.

For example, the floor plan information 110 of the building may include information about a structure of the building such as a position, a height, a thickness, and a structure of a steel frame, a steel bar, piping, and the like that are included in the structure of the building. It should also be appreciated that the magnetic field information of the building 110 may provide information about various metals, and other materials that may have an influence on a magnetic field of and around the building in addition to the steel piping and bars.

According to various examples, the floor plan may be included in a diagram. The diagram may be a drawing in which civil engineering, architecture, mechanics, land, forestry, and the like of a site are illustrated using a drafting apparatus. Also, the diagram may refer to a general floor plan, a blueprint, an assembly drawing, and the like.

As an example, the floor plan information 110 of the building may include information with respect to a two-dimensional (2D) floor plan and a three-dimensional (3D) space. Here, the floor plan information 110 of the building may include 3D information with respect to a configuration, a location, a disposition, and/or a structure of each floor in a multi-story building. In this example, although the location on the each floor may appear to be identical on the 2D floor plan, the location on the each floor may be displayed differently due to a height difference in the 3D space. Additionally, the floor plan information 110 of the building may include a variety of information that may be found on a building floor plan.

The server 130 may store the floor plan information 110 of the building in a storing apparatus, for example, a database. The server 130 may use the floor plan information 110 of the building by downloading the floor plan information 110 from a public office, information providing organization, and the like, through a wired/wireless network. Here, the server 130 may be a simulation server that creates the magnetic field map. While the example in FIG. 1 describes a server 130 that downloads the floor plan and creates the magnetic field map, it should also be appreciated that a mobile terminal, or other device may be used to download the floor plan and create the magnetic field map.

The magnetic field map 150 may include magnetic field values with respect to a plurality of locations included in a predetermined area, for example, a building, and the like, for which a location is to be estimated. Here, the plurality of locations may be a plurality of locations that are at a predetermined interval, or a plurality of locations that are at places at where the magnetic field value may be measured or at places that appear in the floor plan information 110 of the building.

According to various aspects, the server 130 may establish the magnetic field map by extracting magnetic field information from a steel bar distribution and a pipe distribution on a floor, a ceiling, and a wall, without measuring the magnetic field value with respect to each location in the building.

Figure 2:
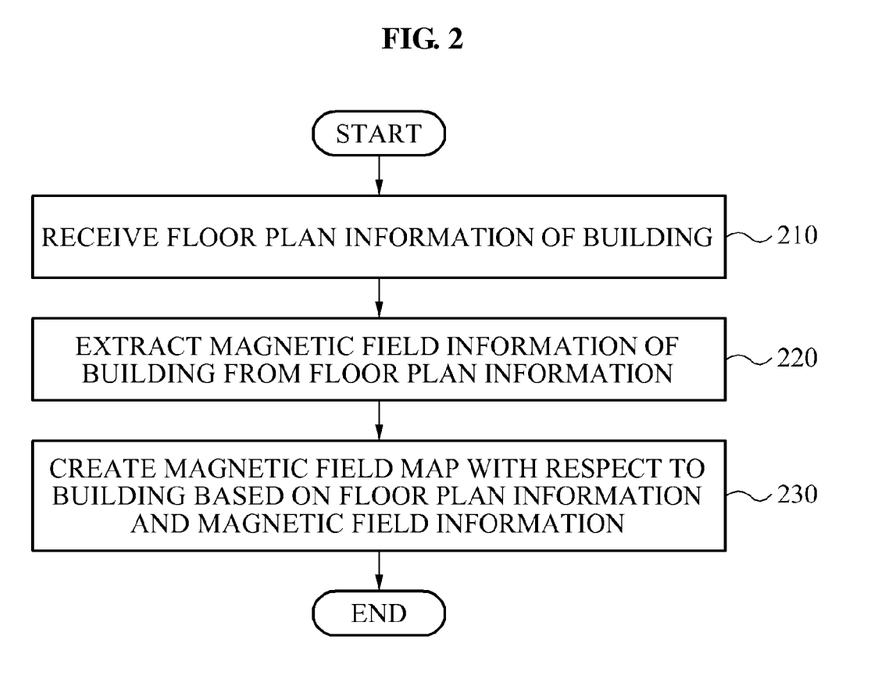
FIG. 2 is a diagram illustrating an example of a method of creating a magnetic field map.

FIG. 2 illustrates an example of a method of creating a magnetic field map. The methods described herein may be performed by an apparatus for creating a magnetic field map. For example, the apparatus may be or may be included in a terminal such as a computer, a laptop, a smart phone, a server, a tablet, an appliance, and the like.

Referring to FIG. 2, in 210, floor plan information of a building is received. For example, the floor plan information of the building may include information about a structure of the building such as a floor, a ceiling, a wall, and the like. The information may also include a position, a height, a thickness, and a structure of a steel frame, a steel bar, piping, and the like that configure the structure of the building. According to various aspects, the floor plan information of the building may include information about various metals and materials that may influence the magnetic field of the building, and information about a 2D floor plan and a 3D space of a structure formed by the various metals and the materials.

In 220, magnetic field information of the building is extracted from the floor plan information. For example, the magnetic field information may be a magnetic field value that is calculated or predicted at various locations of and around the building and information that is associated with the magnetic field value.

In general, a magnetic field value may be susceptible to interference by an external magnetic object. For example, the interference may be greater when three external magnetic objects are present in comparison to a single external magnetic object being present. Also, the magnetic (value) may vary based on a thickness or a structure of a magnetic object. Accordingly, magnetic interference may vary between positions at which differing numbers of metallic structures are installed or otherwise disposed.

For example, the floor plan information of the building may indicate that one steel structure is included at one location in the building and a plurality of steel structures are installed at another location of the building. In this example, magnetic interference may be different at each of the two locations. Also, the magnetic interference may vary based on whether the steel structures are in a form of a steel frame, a steel bar, or a wire. Furthermore, a disposition of the steel structures may also influence the magnetic interference.

According to various aspects, the magnetic interference in each location of the building may be calculated from information about the structure of the building, such as the position, the height, the thickness, and the structure of the steel frame, the steel bar, the piping, and the like that configure the structure of the building. Accordingly, the magnetic field information with respect to various locations of the building may be extracted based on the calculation.

In 230, a magnetic field map of the building is created based on the floor plan information and the magnetic field information.

Figure 3:
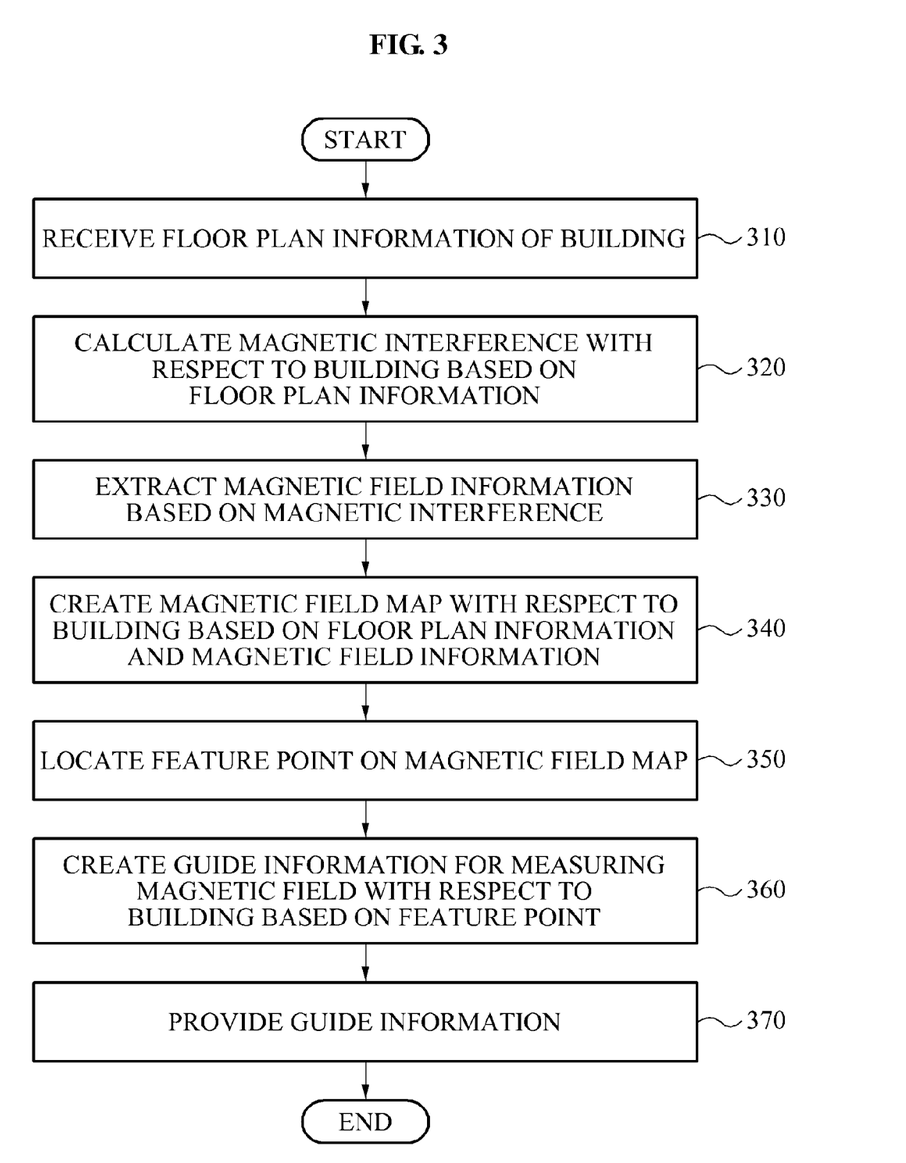
FIG. 3 is a diagram illustrating another example of a method of creating a magnetic field map.

FIG. 3 illustrates another example of a method of creating a magnetic field map.

Referring to FIG. 3, in 310, floor plan information of the building is received.

In 320, magnetic interference of the building is calculated based on the floor plan information. For example, an apparatus may calculate the magnetic interference at various locations of the building from information about a structure of the building, a position, a height, a thickness, and a structure of a steel frame, a steel bar, and piping that configure the building, and a pipe. For example, a quantity of magnetic interference of a wall, a quantity of magnetic interference of stairs, and a quantity of magnetic interference for each space on a first floor and a second floor of the building may be calculated.

In 330, magnetic field information is extracted based on the magnetic interference. For example, the magnetic field information may be a magnetic field value that is calculated or predicted at the each location of the building and information related to the magnetic field value. For example, the apparatus may pre-store or predict information of a distribution of magnetic field values about portions of the building based on the floor plan information. Also, the apparatus may calculate the magnetic field value of each point of the building at which the magnetic field map is to be created based on the calculated magnetic interference and the pre-stored information in 320.

In 340, the magnetic field map of the building is created based on the floor plan information and the magnetic field information.

Also, in 350, a feature point is determined based on the magnetic field map based on the floor plan information and the magnetic field information. For example, the feature point may be located at an area in which a change of a magnetic field exceeds a predetermined degree of deviation, or a change in pattern. Also, the feature point may correspond to an area in which a structure changes greatly, such as in a corner area or staircases where there is a change in a flight of stairs. An example of a method of locating a feature point is described with reference to FIG. 4.

In 360, guide information for measuring the magnetic field of the building may be created based on the feature point. For example, the guide information may include a location at which the magnetic field is to be measured in the building and an interval at which the magnetic field is to be measured. Accordingly, a sampling measurement interval of the magnetic field may be created.

For example, the interval at which the magnetic field is to be measured may be set to be denser (i.e. more often and in shorter intervals) in a location of the feature point than in comparison to another location. As another example, the interval at which the magnetic field is to be measured may be set to be wider in a remaining location other than the location including the feature point. As another example, the interval at which the magnetic field is to be measured may be set to be denser in a location where a structure changes greatly, such as in a corner area, a staircase, and the like.

In 370, guide information is provided to, for example, an apparatus for measuring a magnetic field, a robot for measuring a magnetic field, and the like. By providing the guide information to the apparatus for measuring the magnetic field, or the robot for measuring the magnetic field, magnetic field information may be measured by the apparatus or the robot in relatively little time, for example, by providing an interval at which the magnetic field is to be measured.

Figure 4:
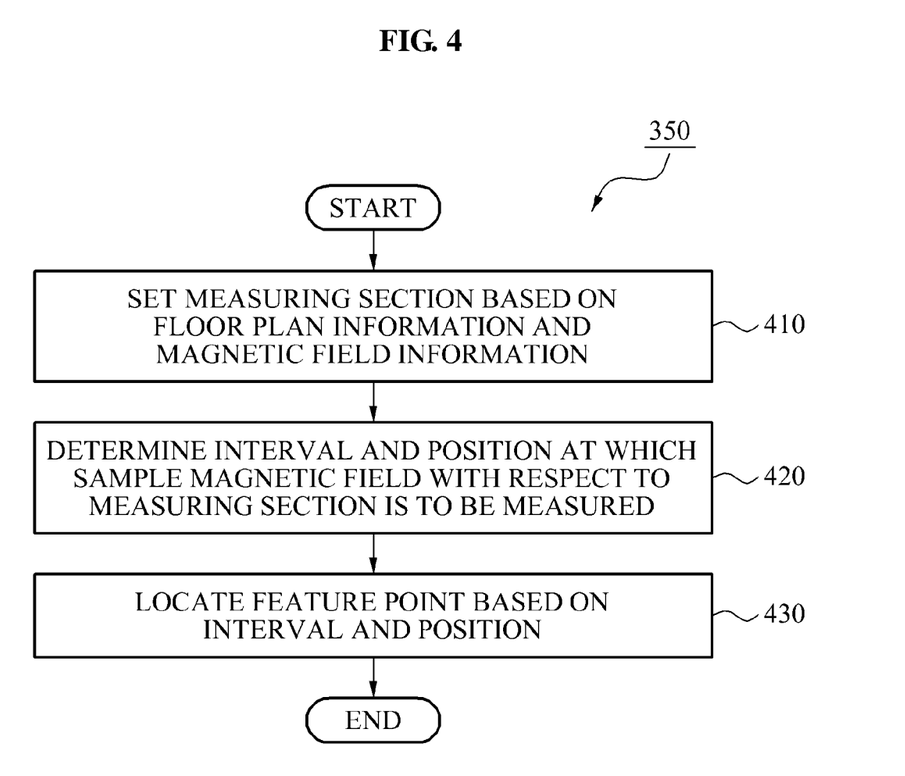
FIG. 4 is a diagram illustrating an example of a method of locating a feature point.

FIG. 4 illustrates an example of a method of locating a feature point.

Referring to FIG. 4, In 410, a measuring section with respect to an interior of a building may be set based on floor plan information and magnetic field information. For example, a plurality of measuring sections of the building may be set based on a structure of the building that is determined from the floor plan information and based on the magnetic field information of each area based on the structure.

In 420, an interval and/or a position at which a sample magnetic field is to be measured are determined. For example, the interval and the position at which the sample magnetic field is to be measured may be dense at sections where a structure changes radically, such as in a corner area or staircases where there is a change in a flight of stairs, or a point at which there is a large difference in magnetic field information from an adjacent point.

In 430, a feature point is located based on the interval and the position at which the sample magnetic field is to be measured. For example, the creating apparatus may locate a feature point at an area in which a change of the magnetic field exceeds a predetermined degree of deviation based on the interval and the position determined in 420.

For example, a feature point may be set at an area in which a change of the magnetic field in a corresponding building exceeds a predetermined degree of deviation, for example, a first value '10', based on the floor plan information and the magnetic field information with respect to a corresponding interval and a corresponding position at which the magnetic field is to be measured.

Figure 5:
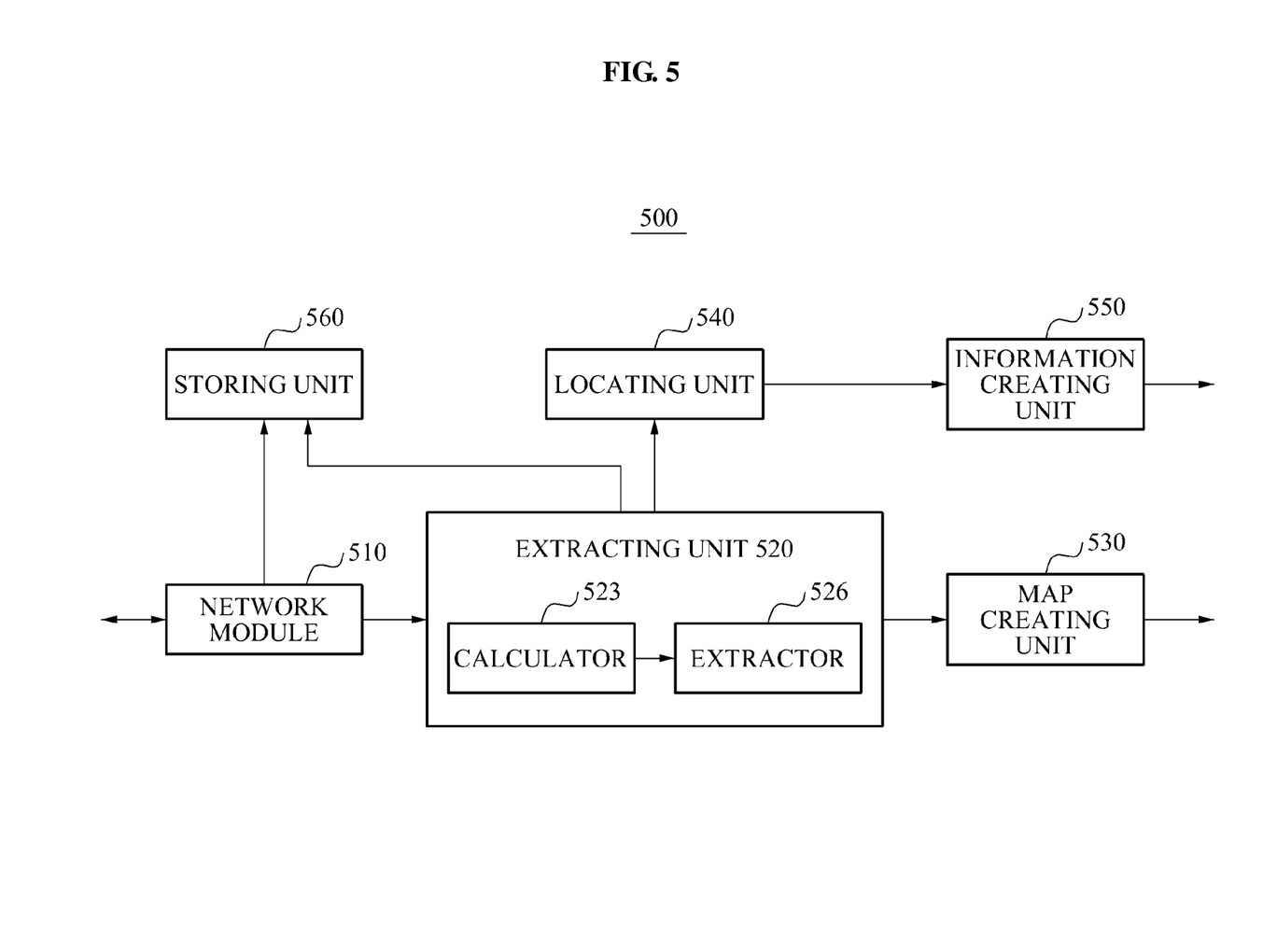
FIG. 5 is a diagram illustrating an example of an apparatus for creating a magnetic field map.

FIG. 5 illustrates an example of an apparatus for creating a magnetic field map. For example, the apparatus may be a terminal such as a server, a computer, a tablet, a smart phone, an appliance, and the like.

Referring to FIG. 5, the apparatus for creating the magnetic field map, hereinafter referred to as a creating apparatus 500, includes a network module 510, an extracting unit 520, and a map creating unit 530. In some examples, the creating apparatus 500 may further include a locating unit 540, an information creating unit 550, and/or a storing unit 560.

The network module 510 may receive floor plan information of a building. For example, the floor plan information of the building may include information about a structure of the building, a position, a height, a thickness, and a structure of a steel frame, a steel bar, piping, and the like that configure the structure of the building.

The extracting unit 520 may extract magnetic field information of the building from the floor plan information. For example, the extracting unit 520 may include a calculator 523 and an extractor 526. The calculator 523 may calculate magnetic interference in and around the building based on the floor plan information. The extractor 526 may extract the magnetic field information based on the magnetic interference.

The map creating unit 530 may create a magnetic field map of the interior and/or the exterior of the building based on the floor plan information and the magnetic field information.

The locating unit 540 may locate a feature point on the magnetic field map based on the floor plan information and the magnetic field information. For example, the locating unit 540 may set a measuring section based on the floor plan information and the magnetic field information, determine an interval and/or a position at which a sample magnetic field is to be measured within the measuring section, and locate the feature point based on the interval and the position. Here, the feature point may indicate an area in which a change of the magnetic field on the magnetic field map exceeds a predetermined degree of deviation.

The information creating unit 550 may create guide information for measuring the magnetic field with respect to the building based on the feature point. For example, the guide information may include a position at which the magnetic field is to be measured and an interval at which the magnetic field is to be measured.

According to various aspects, the network module 510 may provide the guide information to an apparatus for measuring a magnetic field, a robot for measuring a magnetic field, and the like. The storing unit 560 may store the floor plan information and the magnetic information. Although not shown, the apparatus may further include a display to display the magnetic field map.

According to various aspects, a magnetic field map may be generated based on a floor plan of a structure. Accordingly, the magnetic field map with respect to the building may be used to determine a location of a terminal.

The apparatus and the elements described in embodiments may be embodied using at least one universal computer or special purpose computer such as a processor, a controller, an arithmetic logic unit (ALU), a digital signal processor, a microcomputer, a field programmable array (FPA), a programmable logic unit (PLU), a microprocessor, or another apparatus for implementing and responding to an instruction. The processor may implement an operating system (OS) and at least one software application that is implemented on the OS. Also, the processor may approach, store, operate, process, and create data in response to the implementation of software. A single processor may be used for ease of understanding, however, those skilled in the art may appreciate that the processor may include a plurality of processing elements and/or a plurality of processing element types. For example, the processor may include a plurality of processors or a single controller. Also, another processing configuration such as a parallel processor may be possible.

The software described herein may include alone or in combination with at least one of a computer program, a code, and an instruction, configuring the processor to operate as desired, or instruct the processor independently or collectively. The software and/or the data may be embodied permanently or temporarily in any type of machine, component, physical equipment, virtual equipment, computer storage medium or device, or transmitted signal wave, in order to be interpreted by the processor or to provide the processor with the instruction or the data. The software may be distributed on a computer system connected by a network, stored or implemented in the distributed method. The software and the data may be stored in one or more non-transitory computer-readable storage media.

As a non-exhaustive illustration only, a terminal/device/unit described herein may refer to mobile devices such as a cellular phone, a personal digital assistant (PDA), a digital camera, a portable game console, and an MP3 player, a portable/personal multimedia player (PMP), a handheld e-book, a portable laptop PC, a global positioning system (GPS) navigation, a tablet, a sensor, and devices such as a desktop PC, a high definition television (HDTV), an optical disc player, a setup box, a home appliance, and the like that are capable of wireless communication or network communication consistent with that which is disclosed herein.

Program instructions to perform a method described herein, or one or more operations thereof, may be recorded, stored, or fixed in one or more computer-readable storage media. The program instructions may be implemented by a computer. For example, the computer may cause a processor to execute the program instructions. The media may include, alone or in combination with the program instructions, data files, data structures, and the like. Examples of computer-readable storage media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The program instructions, that is, software, may be distributed over network coupled computer systems so that the software is stored and executed in a distributed fashion. For example, the software and data may be stored by one or more computer readable storage mediums. Also, functional programs, codes, and code segments for accomplishing the example embodiments disclosed herein can be easily construed by programmers skilled in the art to which the embodiments pertain based on and using the flow diagrams and block diagrams of the figures and their corresponding descriptions as provided herein. Also, the described unit to perform an operation or a method may be hardware, software, or some combination of hardware and software. For example, the unit may be a software package running on a computer or the computer on which that software is running.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method of creating a magnetic field map, the method comprising:

receiving floor plan information of a building;
extracting magnetic field information of the building based on the floor plan information of the building;
creating a magnetic field map of the building based on the floor plan information and the magnetic field information,
determining a location of a feature point on the magnetic field map based on the floor plan information and the magnetic field information, wherein the feature point comprises an area in which a change of a magnetic field on the magnetic field map exceeds a predetermined degree of deviation;
creating guide information for measuring a magnetic field with respect to the building based on the feature point; and
providing the guide information to at least one of a mobile terminal and a robot.

2. The method of claim 1, wherein the floor plan information comprises at least one of a position, a height, a thickness, and a size of a steel frame, a steel bar, and/or piping that is included in the building.

3. The method of claim 1, wherein the determining the location of the feature point comprises:
setting a position of a section to be measured based on the floor plan information and the magnetic field information;
determining an interval and a location at which a sample magnetic field is to be measured with respect to the section; and
determining the location of the feature point based on the interval and the location at which the sample magnetic field is to be measured.

4. The method of claim 1, wherein the guide information comprises:
a location in the building at which a magnetic field is to be measured and an interval at which the magnetic field is to be measured.

5. A non-transitory computer-readable medium comprising a program for instructing a computer to perform the method of claim 1.

6. The method of claim 1, wherein the extracting the magnetic field information of the building comprises:
calculating a magnetic interference with respect to the building based on the floor plan information; and
extracting the magnetic field information based on the magnetic interference.

7. An apparatus for creating a magnetic field map, the apparatus comprising:
a network module configured to receive floor plan information of a building;
an extracting unit configured to extract magnetic field information of the building based on the floor plan information of the building; and
a map creating unit configured to create a magnetic field map of the building based on the floor plan information and the magnetic field information;
a locating unit configured to determine a location of a feature point on the magnetic field map based on the floor plan information and the magnetic field information, wherein the feature point comprises an area in which a change of a magnetic field on the magnetic field map exceeds a predetermined degree of deviation; and
an information creating unit configured to create guide information for measuring a magnetic field with respect to the building based on the feature point,
wherein the network module is configured to provide the guide information to at least one of a mobile terminal and a robot.

8. The apparatus of claim 7, wherein the floor plan information comprises at least one of a position, a height, a thickness, and a size of a steel frame, a steel bar, and/or piping that is included in the building.

9. The apparatus of claim 7, wherein the locating unit is configured to set a section to be measured based on the floor plan information and the magnetic field information, determine an interval and a location at which a sample magnetic field is to be measured with respect to the section, and determine the location of the feature point based on the interval and the location at which the sample magnetic field is to be measured.

10. The apparatus of claim 7, wherein the guide information comprises:
a location in the building at which a magnetic field is to be measured and an interval at which the magnetic field is to be measured.

11. The apparatus of claim 7, further comprising:
a storing unit configured to store the floor plan information and the magnetic field information.

12. The apparatus of claim 7, wherein the extracting unit comprises:
a calculator configured to calculate a magnetic interference with respect to the building based on the floor plan information; and
an extractor configured to extract the magnetic field information based on the magnetic interference.

* * * * *